United States Patent
Sato et al.

(10) Patent No.: US 9,728,242 B1
(45) Date of Patent: Aug. 8, 2017

(54) MEMORY DEVICE

(71) Applicant: KABUSHIKI KAISHA TOSHIBA, Minato-ku, Tokyo (JP)

(72) Inventors: Motoyuki Sato, Seoul (KR); Kazumasa Sunouchi, Seoul (KR); Keisuke Nakatsuka, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/267,125

(22) Filed: Sep. 15, 2016

Related U.S. Application Data

(60) Provisional application No. 62/304,058, filed on Mar. 4, 2016.

(51) Int. Cl.
  *G11C 11/16* (2006.01)

(52) U.S. Cl.
  CPC .......... *G11C 11/1675* (2013.01); *G11C 11/16* (2013.01); *G11C 11/161* (2013.01); *G11C 11/1673* (2013.01)

(58) Field of Classification Search
  CPC ........................... G11C 11/16; G11C 13/0069
  USPC .................................................. 365/158, 173
  See application file for complete search history.

(56) References Cited

U.S. PATENT DOCUMENTS

| | | | |
|---|---|---|---|
| 6,791,865 B2 | 9/2004 | Tran et al. | |
| 7,035,137 B2 | 4/2006 | Iwata et al. | |
| 7,079,414 B2 | 7/2006 | Iwata et al. | |
| 8,705,273 B2 * | 4/2014 | Kim | G11C 5/14 365/185.03 |
| 9,379,315 B2 * | 6/2016 | Chen | H01L 43/12 |
| 9,401,210 B2 * | 7/2016 | Kwon | G11C 16/10 |
| 9,406,368 B2 * | 8/2016 | Bose | G11C 11/1675 |
| 9,424,932 B2 * | 8/2016 | Choi | G11C 16/10 |
| 9,542,989 B2 * | 1/2017 | Gogl | G11C 11/1675 |

* cited by examiner

*Primary Examiner* — Michael Tran
(74) *Attorney, Agent, or Firm* — Holtz, Holtz & Volek PC

(57) ABSTRACT

According to one embodiment, a memory device includes a spin transfer torque magnetoresistive element including a first magnetic layer, a second magnetic layer, and a nonmagnetic layer between the first magnetic layer and the second magnetic layer, a temperature detecting unit detecting an ambient temperature of the magnetoresistive element, and a write voltage generating unit generating a write voltage for the magnetoresistive element in accordance with the temperature detected by the temperature detecting unit.

19 Claims, 5 Drawing Sheets

US 9,728,242 B1

MEMORY DEVICE

CROSS-REFERENCE TO RELATED APPLICATIONS

This application claims the benefit of U.S. Provisional Application No. 62/304,058, filed Mar. 4, 2016, the entire contents of which are incorporated herein by reference.

FIELD

Embodiments described herein relate generally to memory device.

BACKGROUND

A memory device (semiconductor integrated circuit device) wherein magnetoresistive elements and transistors are integrated on a semiconductor substrate has been proposed.

The magnetoresistive elements have a problem that their lifetime is reduced if the temperature during writing is high.

Accordingly, there is a demand for a memory device that can suppress reduction of the lifetime of magnetoresistive elements.

DETAILED DESCRIPTION

In general, according to one embodiment, a memory device includes a spin transfer torque magnetoresistive element including a first magnetic layer, a second magnetic layer, and a nonmagnetic layer between the first magnetic layer and the second magnetic layer; a temperature detecting unit detecting an ambient temperature of the magnetoresistive element; and a write voltage generating unit generating a write voltage for the magnetoresistive element in accordance with the temperature detected by the temperature detecting unit.

The embodiment will be described with reference to the accompanying drawings.

Figure 1:
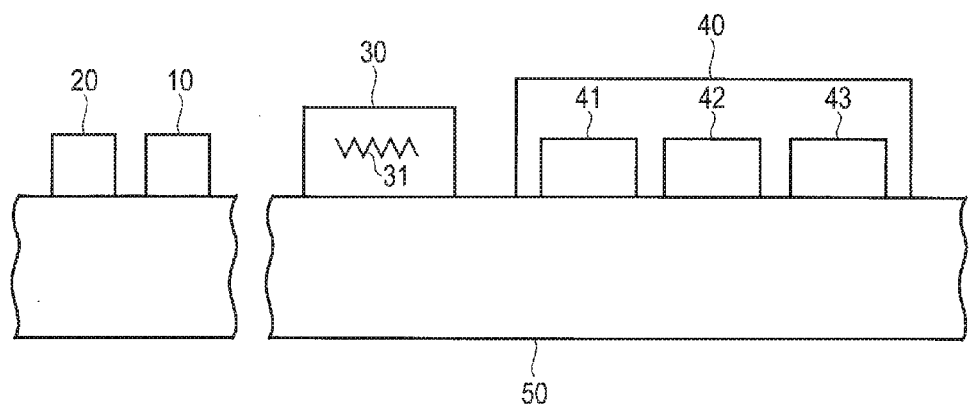
FIG. 1 is a schematic view showing the conceptual structure of a memory device according to an embodiment.

FIG. 1 is a schematic diagram showing the conceptual structure of a memory device (semiconductor integrated circuit device) according to an embodiment.

The memory device shown in FIG. 1 comprises a magnetoresistive element 10, a select transistor 20, a temperature detecting unit 30, and a voltage generating unit 40. The voltage generating unit 40 includes a write voltage generating unit 41, a gate voltage generating unit 42, and a read voltage generating unit 43. The magnetoresistive element 10, the select transistor 20, the temperature detecting unit 30 and the voltage generating unit 40 (the write voltage generating unit 41, the gate voltage generating unit 42, the read voltage generating unit 43) are formed on a single semiconductor substrate 50. In other words, the magnetoresistive element 10, the select transistor 20, the temperature detecting unit 30, and the voltage generating unit 40 (the write voltage generating unit 41, the gate voltage generating unit 42, the read voltage generating unit 43) are provided in the same integrated circuit chip. The magnetoresistive element 10 is also called a magnetic tunnel junction (MTJ) element.

Figure 2:
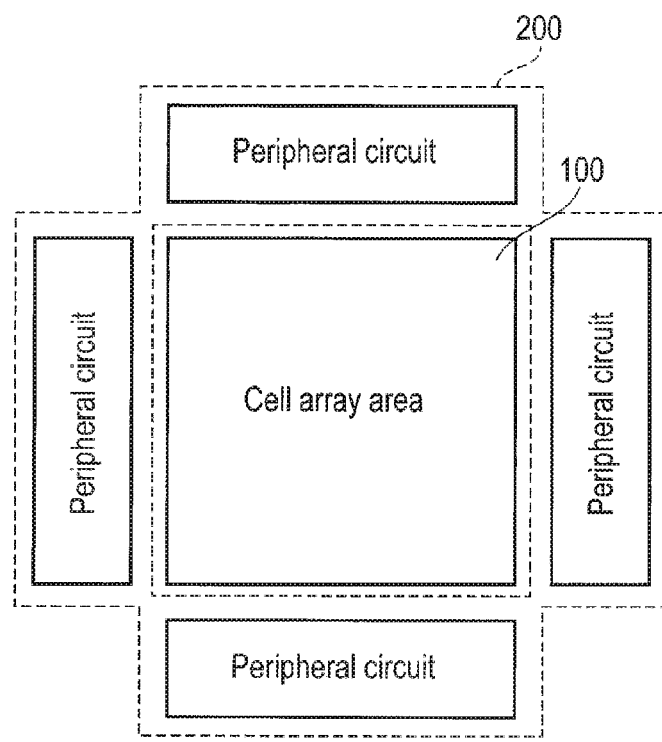
FIG. 2 is a schematic view showing a cell array area and a peripheral circuit area in the memory device of the embodiment.

FIG. 2 is a schematic view showing a cell array area and a peripheral circuit area in the memory device (semiconductor integrated circuit device) of the embodiment.

A cell array area 100 includes the magnetoresistive element 10, and the select transistor 20 connected to the magnetoresistive element 10 in series. A peripheral circuit area 200 is provided outside the cell array area 100, and includes the temperature detecting unit 30 and the voltage generating unit 40 (the write voltage generating unit 41, the gate voltage generating unit 42, the read voltage generating unit 43). The peripheral circuit area 200 also includes a write circuit and a read circuit for the magnetoresistive element 10.

Figure 3:
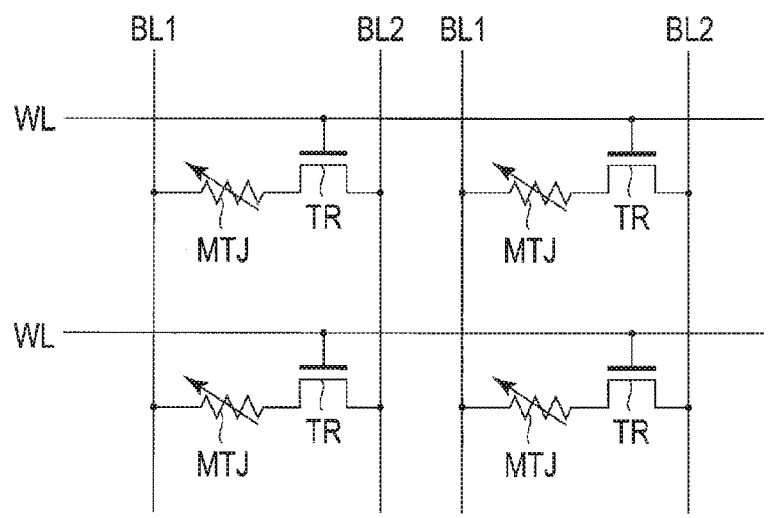
FIG. 3 is an equivalent circuit diagram showing the circuit structure of the cell array area of the memory device according to the embodiment.

FIG. 3 is an equivalent circuit diagram showing the circuit structure of the cell array area 100 of the memory device (semiconductor integrated circuit device) according to the embodiment.

As shown in FIG. 3, series-circuit units of the magnetoresistive elements MTJ (corresponding to the magnetoresistive elements 10) and MOS transistors TR (corresponding to the select transistors 20) are arranged in an array. A first bit line BL1 is connected to one end of each series-circuit unit, and a second bit line BL2 is connected to the other end of each series-circuit unit. A word line WL is connected to the gate electrode of each MOS transistor TR.

Figure 4:
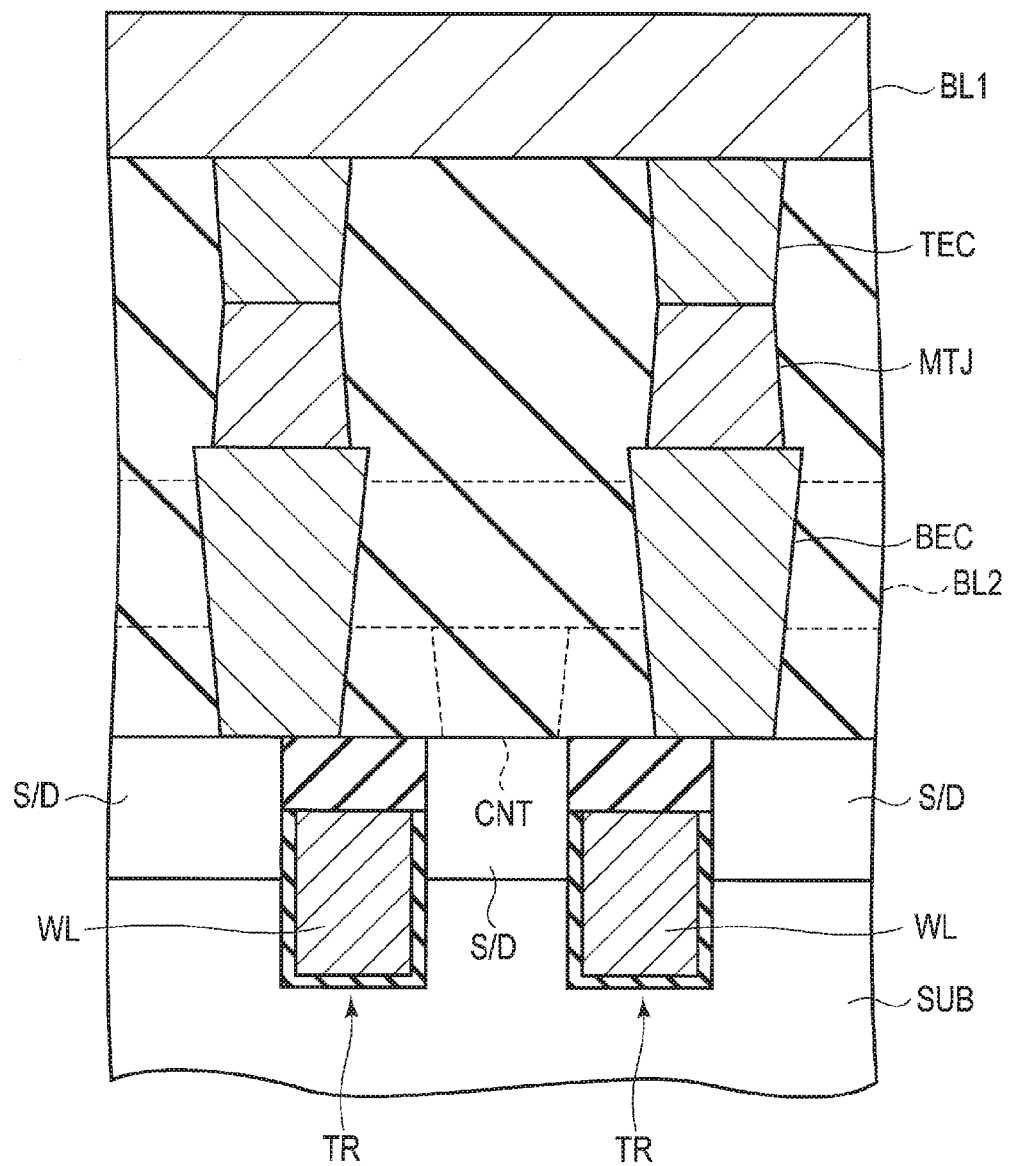
FIG. 4 is a schematic cross-sectional view showing the structure of the cell array area in the memory device according to the embodiment.

FIG. 4 is a schematic cross-sectional view showing the structure of the cell array area 100 in the memory device (semiconductor integrated circuit device) according to the embodiment.

As shown in FIG. 4, buried-gate MOS transistors TR (corresponding to the select transistors 20) are formed in a semiconductor substrate SUB. The gate electrode of each MOS transistor TR is used as a word line WL. One of the source/drain areas S/D of each MOS transistor TR is connected to a bottom electrode BEC, and the other of the source/drain areas S/D is connected to a contact CNT.

The magnetoresistive element MTJ (corresponding to the magnetoresistive element 10) is formed on the bottom electrode BEC, and a top electrode TEC is formed on the magnetoresistive element MTJ. A first bit line BL1 is connected to the top electrode TEC. A second bit line BL2 is connected to the contact CNT.

Figure 5:
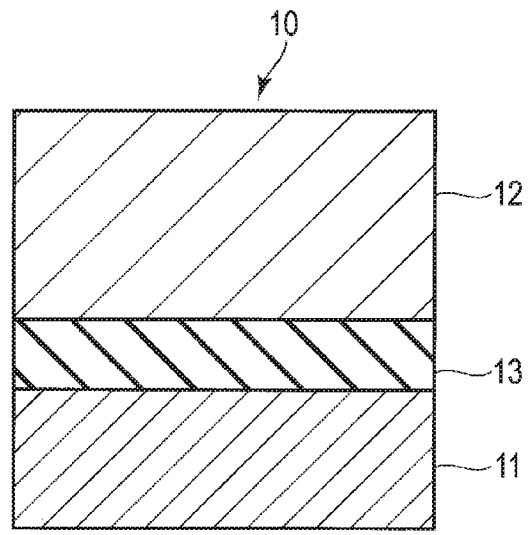
FIG. 5 is a schematic cross-sectional view showing the basic structure of a magnetoresistive element included in the memory device according to the embodiment.

FIG. 5 is a schematic cross-sectional view showing the basic structure of the magnetoresistive element 10 included in the memory device (semiconductor integrated circuit device) according to the embodiment.

The magnetoresistive element 10 is a spin transfer torque (STT) magnetoresistive element, and includes a storage layer (first magnetic layer) 11 having a variable magnetization direction, a reference layer (second magnetic layer) 12 having a fixed magnetization direction, and a tunnel barrier layer (nonmagnetic layer) 13 between the storage layer 11 and the reference layer 12. The storage layer 11, the reference layer 12 and the tunnel barrier layer 13 are stacked on the major surface of the semiconductor substrate perpendicularly to the major surface. Both the storage layer 11 and the reference layer 12 are ferromagnetic layers having perpendicular magnetization. That is, the storage layer 11 has a perpendicular magnetization direction with respect to its major surface, and the reference layer 12 has a perpendicular magnetization direction with respect to its major surface. The magnetoresistive element 10 may further include a shift canceling layer for canceling the magnetic field applied by the reference layer 12 to the storage layer 11.

The resistance of the stacked structure (i.e., the resistance of the magnetoresistive element 10), which is assumed when the magnetization direction of the storage layer 11 is parallel to the magnetization direction of the reference layer 12, is lower than the resistance of the stacked structure (i.e., the resistance of the magnetoresistive element 10), which is assumed when the magnetization direction of the storage layer 11 is antiparallel to the magnetization direction of the reference layer 12. That is, when the magnetization direction of the storage layer 11 is parallel to the magnetization direction of the reference layer 12, the magnetoresistive element (MTJ element) 10 exhibits a low resistance, while when the magnetization direction of the storage layer 11 is antiparallel to the magnetization direction of the reference layer 12, the magnetoresistive element (MTJ element) 10 exhibits a high resistance. Therefore, the magnetoresistive element 10 can store binary data (0 or 1) in accordance with its resistance state (the low resistance state or the high resistance state). Moreover, the resistance state (the low resistance state and the high resistance state) of the magnetoresistive element 10 can be set in accordance with the direction of a write current that flows through the magnetoresistive element 10.

Figure 6:
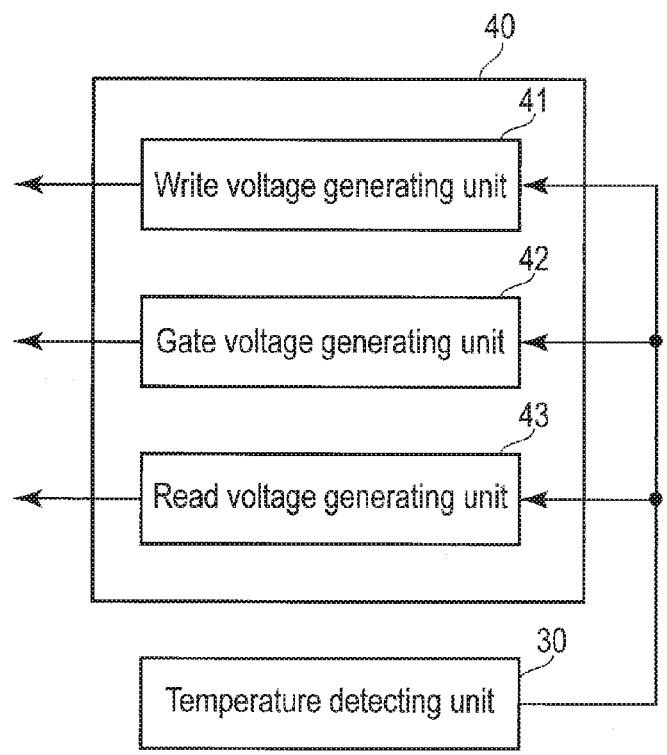
FIG. 6 is a block diagram showing a temperature detecting unit and a voltage generating unit included in the memory device of the embodiment.

FIG. 6 is a block diagram showing the temperature detecting unit 30 and the voltage generating unit 40 included in the memory device (semiconductor integrated circuit device) of the embodiment. As described above, the temperature detecting unit 30 and the voltage generating unit 40 (the write voltage generating unit 41, the gate voltage generating unit 42, the read voltage generating unit 43) are included in the peripheral circuit area 200 (see FIG. 2).

The temperature detecting unit 30 detects a temperature around the magnetoresistive element 10. The temperature detecting unit 30 includes a resistive element 31 (see FIG. 1), the resistance of which depends on the temperature. The resistive element 31 is formed of a semiconducting material. As the semiconductor material, doped polysilicon is used, for example. If doped polysilicon is used as the material of the resistive element 31, the ambient temperature of the magnetoresistive element 10 can be detected, based on the resistance of the resistive element 31, since the resistance of the resistive element 31 decreases as the temperature increases.

The temperature detecting unit 30 is connected to the voltage generating unit 40 that includes the write voltage generating unit 41, the gate voltage generating unit 42, and the read voltage generating unit 43. The voltage generating unit 40 generates various types of voltages in accordance with temperatures detected by the temperature detecting unit 30.

The write voltage generating unit 41 generates a write voltage for the magnetoresistive element 10 in accordance with a temperature detected by the temperature detecting unit 30. The write voltage generating unit 41 will now be described.

When performing a write to the magnetoresistive element 10, it is necessary to apply a voltage to the magnetoresistive element 10 to cause a current to flow through the magnetoresistive element 10. However, in general, if temperature increases during writing, the lifetime of the magnetoresistive element 10 will become short. In particular, in a spin transfer torque magnetoresistive element, where a current flows through a tunnel barrier layer 13 (see FIG. 5) provided between the storage layer 11 and the reference layer 12, the temperature increase significantly influences the reduction of lifetime of the magnetoresistive element 10 because of the tunnel barrier layer 13.

If the write voltage applied to the magnetoresistive element 10 is reduced, the lifetime of the magnetoresistive element 10 can be lengthened. However, simple reduction in the write voltage will increase the write error rate (WER). On the other hand, in the spin transfer torque magnetoresistive element, in general, when the temperature increases, appropriate writing can be performed even if the write voltage (write current) is reduced.

In view of the above, in the embodiment, the write voltage generating unit 41 is configured to generate a write voltage in accordance with the temperature detected by the temperature detecting unit 30. Specifically, the write voltage generated by the write voltage generating unit 41 is controlled to decrease as the temperature detected by the temperature detecting unit 30 increases. The temperature detecting unit 30 detects the ambient temperature of the magnetoresistive element 30 before the write voltage generating unit 41 generates the write voltage for the magnetoresistive element 10. More specifically, the temperature detecting unit 30 detects the ambient temperature of the magnetoresistive element 30 immediately before the write voltage generating unit 41 generates the write voltage.

The write voltage generated by the write voltage generating unit 41 is applied between both ends of the series circuit (see FIG. 3) of the magnetoresistive element 10 (magnetoresistive element MTJ) and the select transistor 20 (MOS transistor TR). That is, the write voltage generated by the write voltage generating unit 41 is applied between both ends of the series circuit via the first bit line BL1 and the second bit line BL2.

As described above, in the embodiment, the write voltage generating unit 41 is controlled to generate a write voltage that decreases as the temperature detected by the temperature detecting unit 30 increases. However, if the write voltage is too low, the write error rate (WER) will increase, such that appropriate writing may not be realized. To avoid this, in the embodiment, the write voltage is controlled to enable the lifetime of the magnetoresistive element 10 and the WER to fall within respective allowable ranges.

Figure 7:
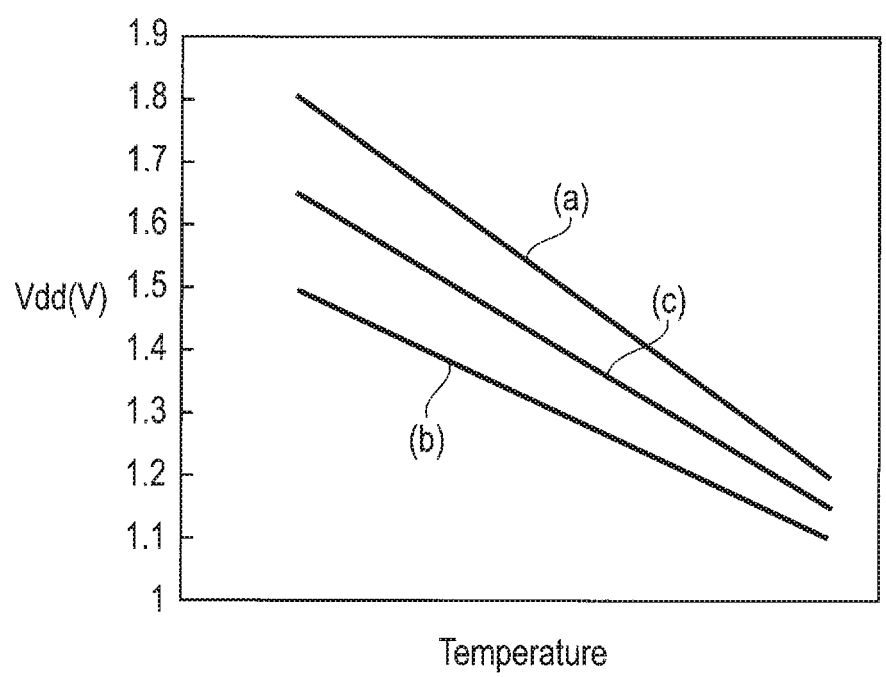
FIG. 7 is a graph showing the relationship between a temperature detected by the temperature detecting unit, and a write voltage.

FIG. 7 shows the relationship between the temperature detected by the temperature detecting unit 30 and the write voltage (Vdd). Line (a) indicates the maximum allowable voltage with respect to the temperature detected by the temperature detecting unit 30. Line (b) indicates the minimum allowable voltage with respect to the temperature detected by the temperature detecting unit 30. Line (c) indicates the write voltage generated by the write voltage generating unit 41, and set between the maximum allowable voltage and the minimum allowable voltage. The maximum allowable voltage is based on an allowable lifetime (allowable lifetime specifications) for the magnetoresistive element 10, while the minimum allowable voltage is based on an allowable write error rate (WER) (allowable WER specifications) for the magnetoresistive element 10. That is, the maximum allowable voltage corresponds to the maximum write voltage that realizes a lifetime allowed to the magnetoresistive element 10, and the minimum allowable voltage corresponds to the minimum write voltage that realizes a write error rate (WER) allowed to the magnetoresistive element 10. The write voltage generated by the write voltage generating unit 41 is set between the maximum allowable voltage and the minimum allowable voltage with respect to the temperature detected by the temperature detecting unit 30.

The gate voltage generating unit 42 of FIG. 6 generates a gate voltage for selecting the select transistor 20 in accordance with the temperature detected by the temperature detecting unit 30. The gate voltage generating unit 42 generates the gate voltage from the same viewpoint as in the write voltage generating unit 41. That is, the gate voltage generating unit 42 generates the gate voltage so that the voltage applied to the magnetoresistive element 10 (a current that flows through the magnetoresistive element 10) will decrease as the temperature detected by the temperature detecting unit 30 increases. In other words, the gate voltage generating unit 42 generates the gate voltage so that the current flowing through the select transistor 20 will decrease, as the temperature detected by the temperature detecting unit 30 increases. More specifically, when an N-channel MOS transistor is used as the select transistor 20, the gate voltage generating unit 42 reduces the gate voltage as the temperature detected by the temperature detecting unit 30 increases. The gate voltage generated by the gate voltage generating unit 42 is applied to the select transistor 20 via the word line WL (see FIG. 3).

The read voltage generating unit 43 of FIG. 6 generates a read voltage for the magnetoresistive element 10 in accordance with the temperature detected by the temperature detecting unit 30. The read voltage generating unit 43 generates the read voltage from the same viewpoint as in the write voltage generating unit 41. That is, the read voltage generating unit 43 is controlled to generate a read voltage that decreases as the temperature detected by the temperature detecting unit 30 increases. The read voltage generated by the read voltage generating unit 43 is applied between both ends of the series circuit (see FIG. 3) of the magnetoresistive element 10 (magnetoresistive element MTJ) and the select transistor 20 (MOS transistor TR) via the first bit line BL1 and the second bit line BL2.

As described above, in the embodiment, since the temperature detecting unit 30 and the write voltage generating unit 41 are provided, and the write voltage for the magnetoresistive element 10 is generated in accordance with the temperature detected by the temperature detecting unit 30, an appropriate write voltage can be applied to the magnetoresistive element 10. As a result, reduction in the lifetime of the magnetoresistive element 10 can be suppressed, and an increase in the write error rate (WER) of the magnetoresistive element 10 can also be suppressed. By especially controlling the write voltage generating unit 41 to decrease the write voltage as the temperature detected by the temperature detecting unit 30 increases, the above-described advantage can be obtained more reliably.

Moreover, the above-described advantage can be obtained more reliably by setting the write voltage generated by the write voltage generating unit 41 between the maximum allowable voltage based on a lifetime allowed to the magnetoresistive element 10, and the minimum allowable voltage based on a write error rate (WER) allowed to the magnetoresistive element 10.

Furthermore, the temperature detecting unit 30 can be provided close to the magnetoresistive element 10 by providing the temperature detecting unit 30 and the magnetoresistive element 10 on the same semiconductor substrate (i.e., by providing the temperature detecting unit 30 and the magnetoresistive element 10 within the same integrated circuit chip). This enables the ambient temperature of the magnetoresistive element 10 to be detected exactly, and hence enables an exact write voltage to be applied to the magnetoresistive element 10.

In the above-described embodiment, the write voltage generated by the write voltage generating unit 41 is controlled to decrease as the temperature detected by the temperature detecting unit 30 increases. However, depending upon the characteristics of the magnetoresistive element, the write voltage may be controlled to increase as the temperature detected by the temperature detecting unit 30 increases. The gate voltage generated by the gate voltage generating unit 42 and the read voltage generated by the read voltage generating unit 43 may also be controlled in the same way.

Further, in the above-described embodiment, the gate voltage generating unit 42 and the read voltage generating unit 43 are provided, in addition to the write voltage generating unit 41. However, one or both of the gate voltage generating unit 42 and the read voltage generating unit 43 may not be provided.

In the above-described embodiment, a resistive element formed of a semiconductor material that has a temperature-dependent resistance is used as the temperature detection element of the temperature detecting unit 30. However, a magnetoresistive element different from the magnetoresistive element 10 described above may be provided for temperature detection, and the temperature detection element may be formed utilizing the temperature-dependent resistance of this temperature detection magnetoresistive element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A memory device comprising:
a spin transfer torque magnetoresistive element including a first magnetic layer, a second magnetic layer, and a nonmagnetic layer between the first magnetic layer and the second magnetic layer;
a temperature detecting unit which detects an ambient temperature of the magnetoresistive element; and
a write voltage generating unit which generates a write voltage for the magnetoresistive element in accordance with the temperature detected by the temperature detecting unit,
wherein the write voltage generated by the write voltage generating unit decreases as the temperature detected by the temperature detecting unit increases.

2. The memory device of claim 1, further comprising a select transistor connected in series to the magnetoresistive element.

3. The memory device of claim 2, wherein the write voltage generated by the write voltage generating unit is applied between both ends of a series circuit of the magnetoresistive element and the select transistor.

4. The memory device of claim 3, further comprising first and second bit lines through which the write voltage generated by the write voltage generating unit is applied between the both ends of the series circuit.

5. The memory device of claim 2, further comprising a gate voltage generating unit which generates a gate voltage used to select the select transistor in accordance with the temperature detected by the temperature detecting unit.

6. The memory device of claim 5, wherein the gate voltage generating unit generates the gate voltage such that a current flowing through the select transistor decreases as the temperature detected by the temperature detecting unit increases.

7. The memory device of claim 5, further comprising a word line through which the gate voltage generated by the gate voltage generating unit is applied to the select transistor.

8. The memory device of claim 1, further comprising a read voltage generating unit which generates a read voltage for the magnetoresistive element in accordance with the temperature detected by the temperature detecting unit.

9. The memory device of claim 8, wherein the read voltage generated by the read voltage generating unit decreases as the temperature detected by the temperature detecting unit increases.

10. The memory device of claim 1, wherein the temperature detecting unit includes a resistive element having resistance which depends on temperature.

11. The memory device of claim 10, wherein the resistive element is formed of a semiconductor material.

12. The memory device of claim 11, wherein the semiconductor material is doped polysilicon.

13. The memory device of claim 1, wherein the temperature detecting unit detects the ambient temperature of the magnetoresistive element before the write voltage generating unit generates the write voltage for the magnetoresistive element.

14. The memory device of claim 1, wherein:
the write voltage generated by the write voltage generating unit is a voltage between a maximum allowable voltage and a minimum allowable voltage with respect to the temperature detected by the temperature detecting unit; and
the maximum allowable voltage is based on an allowable lifetime of the magnetoresistive element, and the minimum allowable voltage is based on an allowable write error rate (WER) of the magnetoresistive element.

15. The memory device of claim 1, wherein the magnetoresistive element, the temperature detecting unit and the write voltage generating unit are provided on a same semiconductor substrate.

16. The memory device of claim 1, wherein the magnetoresistive element is provided in a cell array area, and the temperature detecting unit is provided in a peripheral circuit area located outside the cell array area.

17. The memory device of claim 1, wherein the magnetoresistive element is provided in a cell array area, and the write voltage generating unit is provided in a peripheral circuit area located outside the cell array area.

18. The memory device of claim 1, wherein the first magnetic layer has a variable magnetization direction, and the second magnetic layer has a fixed magnetization direction.

19. The memory device of claim 1, wherein the first magnetic layer has a magnetization direction perpendicular to a major surface thereof, and the second magnetic layer has a magnetization direction perpendicular to a major surface thereof.

* * * * *